(12) United States Patent
Sim

(10) Patent No.: US 7,788,619 B2
(45) Date of Patent: Aug. 31, 2010

(54) MEMORIES, MEMORY COMPILING SYSTEMS AND METHODS FOR THE SAME

(75) Inventor: Soung-Hoon Sim, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 492 days.

(21) Appl. No.: 11/819,389

(22) Filed: Jun. 27, 2007

(65) Prior Publication Data

US 2008/0013376 A1    Jan. 17, 2008

(30) Foreign Application Priority Data

Jul. 11, 2006  (KR) .................. 10-2006-0065045

(51) Int. Cl.
*G06F 17/50* (2006.01)
(52) U.S. Cl. .................. 716/10; 716/8; 716/9
(58) Field of Classification Search ............. 716/8–10; 365/185.13, 185
See application file for complete search history.

(56) References Cited

U.S. PATENT DOCUMENTS

| | | | |
|---|---|---|---|
| 4,656,610 A * | 4/1987 | Yoshida et al. | 365/189.07 |
| 5,604,710 A * | 2/1997 | Tomishima et al. | 365/230.03 |
| 5,963,467 A * | 10/1999 | Miyatake et al. | 365/149 |
| 5,970,003 A * | 10/1999 | Miyatake et al. | 365/200 |
| 6,282,150 B1 * | 8/2001 | Edo | 365/233.13 |
| 6,452,851 B1 * | 9/2002 | Endo et al. | 365/205 |
| 2004/0111690 A1 * | 6/2004 | Reuland et al. | 716/17 |
| 2004/0184327 A1 * | 9/2004 | Okuda | 365/199 |
| 2005/0141260 A1 * | 6/2005 | Suzuki | 365/145 |
| 2007/0103956 A1 * | 5/2007 | Akiyoshi | 365/63 |

FOREIGN PATENT DOCUMENTS

| | | |
|---|---|---|
| JP | 08-273389 | 10/1996 |
| JP | 11-135753 | 5/1999 |
| KR | 10-2001-0059000 | 7/2001 |
| KR | 10-2004-0071468 | 8/2004 |

\* cited by examiner

*Primary Examiner*—Sun J Lin
(74) *Attorney, Agent, or Firm*—Harness, Dickey & Pierce, P.L.C.

(57) ABSTRACT

A method of compiling a memory for layout by computation includes inputting memory specification, determining a disposition structure of input/output pads with reference to the memory specification, and creating a layout of the memory in accordance with the determined disposition structure of the input/output pads. A memory includes a plurality of memory banks, a plurality of row decoders and a plurality of input/output pads. Each of the plurality of row decoders is arranged between two memory banks adjacent to each other in a row direction. The plurality of row decoders are configured to selectively activate word lines based on row address signals input from an external source. Each row decoder receives row address signals altering a permutation in accordance with a size of the memory banks.

21 Claims, 8 Drawing Sheets

MEMORIES, MEMORY COMPILING SYSTEMS AND METHODS FOR THE SAME

PRIORITY STATEMENT

This non-provisional U.S. patent application claims priority under 35 U.S.C. §119 to Korean Patent Application No. 2006-65045 filed on Jul. 11, 2006, in the Korean Intellectual Property Office (KIPO), the entire contents of which are incorporated herein by reference.

BACKGROUND

Application-specific integrated circuits (ASICs) are collections of logic and memory circuits designed to conduct specific tasks based on customers' demands. ASICs may be implemented on a silicon die by mapping logical functions to a group of preliminarily designed and verified logic circuits. Those circuits extend to relatively complicated circuits referred to as system-on-chips (SOCs). An SOC is conventionally fabricated by integrating a plurality of functional circuits, such as a microprocessor, a digital signal processor, a memory, etc., into a single chip.

Conventionally, a compilable memory may be included in an SOC. For example, parameters of a memory array in an SOC may be set by an order therefor, meeting qualifications of specific design patterns. Such a compilable memory may offer flexibility in specifying parameters such as the number of word lines, word line width etc., which may enable such a memory to have a more flexible structure for various applications.

A memory such as a cache may have an architecture capable of increasing operating speeds. But, structural elements necessary for enhancing operating speeds may increase memory size. Such an increase in memory size may increase product cost in manufacturing an SOC including the memory.

SUMMARY

Example embodiments relate to semiconductor devices such as memories, memory compiling systems and methods for the same. At least some example embodiments provide memory compiling systems capable of compiling a memory operable at higher speeds and/or having a reduced area. At least some example embodiments provide memory compiling methods capable of creating an improved layout in accordance with a memory cell size.

At least one example embodiment provides a method of compiling a memory for layout by computation. According to at least this example embodiment, a memory specification may be input, and a structure of input/output pads may be determined based on or with reference to the memory specification. A layout of the memory may be created based on the determined structure of the input/output pads.

According to at least some example embodiments, the memory specification may include the number of word lines. The structure may be determined by selecting a first layout by which the input/output pads are arranged at a side of the memory if the number of word lines is less than N (where N is a positive integer).

According to at least some example embodiments, a plurality of regions of memory banks may be created. Each of the plurality of regions may include a plurality of word lines, a plurality of bit lines and a plurality of memory cells arranged at intersections of the plurality of word lines and bit lines. A row decoder region may be created between memory banks adjacent to each other in a row direction. An input/output pad region may be created at each side of the memory banks. A sense amplifier region may be created between the memory bank and the input/output pad regions.

According to at least some example embodiments, the structure of the memory may be determined by selecting a first layout in which the input/output pads are arranged at the center of the memory if the number of word lines is larger than N. In at least this example embodiment, a plurality of memory bank regions may be arranged in rows and columns. Each of the plurality of memory bank regions may include a plurality of word lines, a plurality of bit lines, and a plurality of memory cells arranged at intersections of the plurality of word lines and bit lines. A row decoder region may be created between each of the memory bank regions and adjacent to each other in a row direction. An input/output pad region may be created at each side of the memory banks along a column direction. A sense amplifier region may be created between each memory bank regions and adjacent input/output pad region.

According to at least some example embodiments, the plurality of memory bank regions may be created by disposing N word lines in a plurality of first memory banks arranged at an upper side of the input/output pad regions, and disposing a remaining portion of the word lines in a plurality of second memory banks arranged at a lower side of the input/output pad regions. In creating the plurality memory bank regions, the number of word lines disposed in the plurality of first memory banks may be different from the number of word lines disposed in the plurality of second memory banks. The number of word lines disposed in the plurality of first memory banks may be different from the number of word lines disposed in the plurality of second memory banks by about 4.

At least one other example embodiment provides a computer-based memory design system for compiling a memory. According to at least this example embodiment, the system may include a database configured to store a plurality of device libraries, and a memory compiler configured to create a memory layout by arranging the plurality of device libraries stored in the database based on a specification source. The memory compiler may determine a structure of input/output pads in the memory layout in accordance with the number of word lines set in the specification source.

According to at least some example embodiments, the memory compiler may create the layout of the memory from a first layout in which the input/output pads are arranged at a side of the memory if the number of word lines is less than a given number. The memory compiler may create the layout of the memory from a second layout in which the input/output pads are arranged at the center of the memory if the number of word lines is larger than a given number.

At least one other example embodiment provides a memory compiled by computation when the number of required word lines is larger than N. The memory may include a plurality of memory banks each including a plurality of word lines, a plurality of bit lines and a plurality of memory cells arranged at intersections of the word and bit lines. A plurality of row decoders may be disposed between memory banks adjacent to each other in a row direction. The plurality of word lines may be activated in accordance with row address signals input from an external source. Input/output pads may be disposed between the memory banks adjacent to each other in a column direction. The row decoder may receive row address signals altering a permutation in accordance with a size of the memory banks.

According to at least some example embodiments, first memory banks arranged at the upper side of the input/output pads may include N word lines and second memory banks arranged at the lower side of the input/output pads may include a remaining portion of the word lines if the number of word lines is less than N*2. If the number of word lines is larger than N*2, the number of word lines disposed in the first memory banks at the upper side of the input/output pads may be different from the number of word lines disposed in the second memory banks at the lower side of the input/output pads. The number of word lines disposed in the first memory banks at the upper side of the input/output pads may be different from the number of word lines disposed in the second memory banks at the lower side of the input/output pads by about four.

According to at least some example embodiments, the row address signals may include a bank selection signal. The row decoder corresponding to the first memory banks arranged at the upper side of the input/output pads may activate one of the word lines included in the first memory banks when the bank selection signal is at a first logic level. The row decoder corresponding to the second memory banks arranged at the lower side of the input/output pads may activate one of the word lines included in the second memory banks when the bank selection signal is at a second logic level.

According to at least some example embodiments, a first of the plurality of row decoders may include a first decoder and a second decoder. The first decoder may be configured to generate a plurality of word line selection signals based on a plurality of received row address signals. The second decoder may be configured to selectively activate a word line of one of the plurality of memory banks based on the received plurality of word line selection signals. The one of the plurality of memory banks may be adjacent to the first row decoder.

At least one other example embodiment provides a system on chip including a memory. The memory may be compiled by computation, and may include a plurality of memory banks each including a plurality of word lines, a plurality of bit lines and a plurality of memory cells arranged at intersections of the plurality of word lines and bit lines. A plurality of row decoders may be disposed between the memory banks adjacent to each other in a row direction. The plurality of word lines may be activated in accordance with row address signals input from an externals source. Input/output pads may be disposed between the memory banks adjacent to each other in a column direction. The row decoder may receive the row address signals altering a permutation in accordance with a size of the memory banks.

BRIEF DESCRIPTION OF THE FIGURES

Example embodiments will be described with reference to the following figures, wherein like reference numerals refer to like parts throughout the various figures unless otherwise specified. In the figures.

DETAILED DESCRIPTION OF EXAMPLE EMBODIMENTS

Figure 1:
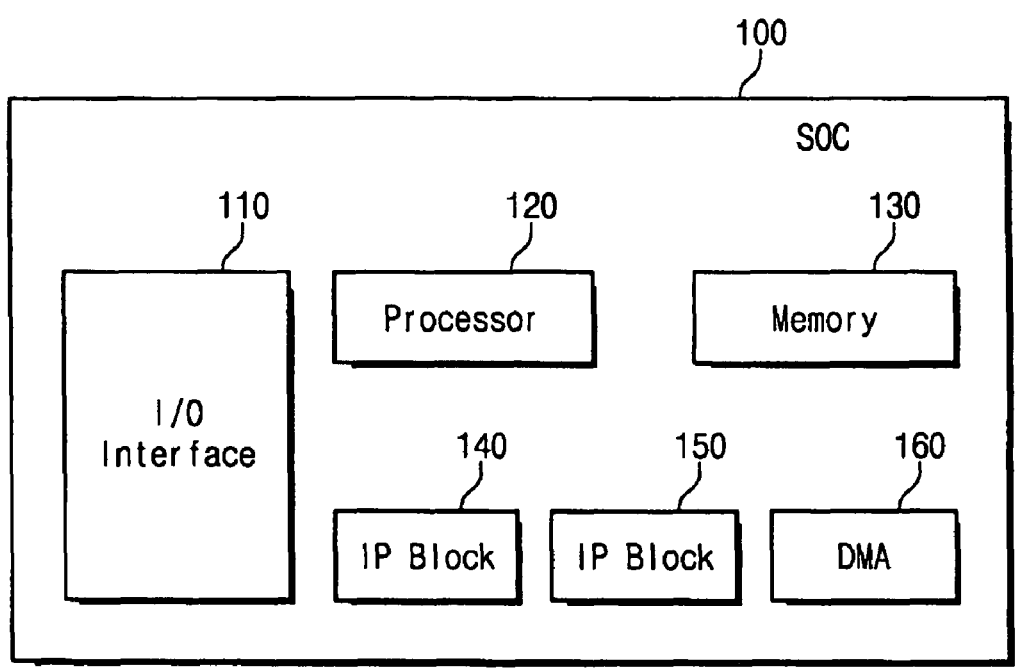
FIG. 1 is a block diagram showing a system-on-chip (SOC) including a compilable memory according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram showing a system-on-chip (SOC) including a compilable memory according to an example embodiment. Referring to FIG. 1, the SOC 100 may include an input/output (I/O) interface 110, a processor 120, a memory 130, a plurality of IP blocks 140 and 150 and a direct memory access (DMA) block 160. The IP blocks 140 and 150 may include a peripheral circuit such as a read-only memory (ROM), phase-locked loop (PLL), etc.

In the example embodiment shown in FIG. 1, the memory 130 may be a compilable memory having a layout designed by computation according to a specification provided from an external source. The compilable memory 130 may be one of a computer-based compilable memory such as a static random access memory (SRAM), dynamic random access memory (DRAM), flash memory, or the like, any or all of which may include a memory layout arranged in accordance with a memory size thereof.

A computer-based memory compiling method according to an example embodiment may be capable of creating a memory layout suitable for a specification provided from an external source, being suitable (e.g., optimized) for high-frequency operation and/or reducing (e.g., minimizing) a memory size.

Memory compiling methods according to at least some example embodiments may enhance operating speed of a memory by creating a first memory layout in which data input/output circuits and pads are arranged at a side of a memory cell array when the number of word lines included in the memory is less than a given number. The first layout may reduce circuit area. Memory compiling methods according to at least some example embodiments may enhance operating speed of a memory by creating a second memory layout in which the data input/output circuits and pads are arranged at the center of the memory cell array when the number of word lines included in the memory is larger than a given number.

Figure 2:
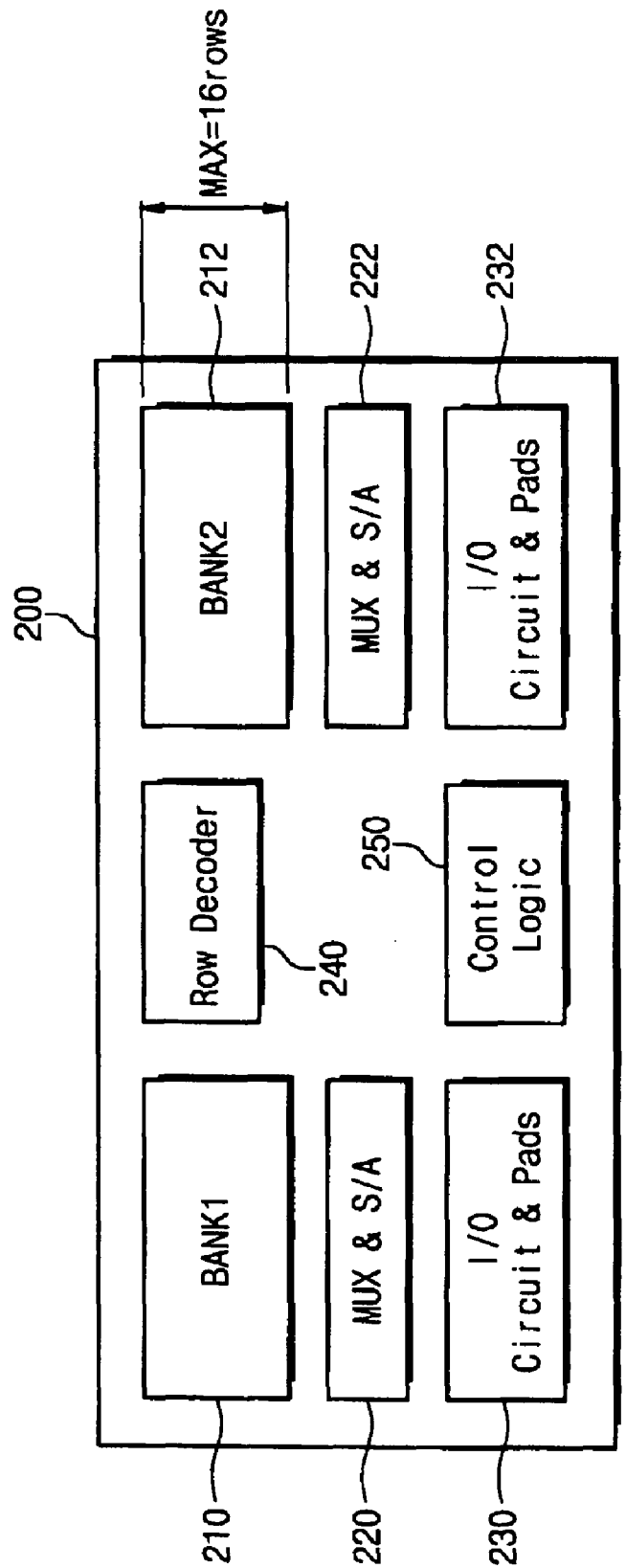
FIG. 2 is a block diagram illustrating a first memory layout designed by a computer-based compiling method according to an example embodiment.

FIG. 2 is a block diagram illustrating a first memory layout designed by a computer-based compiling method according to an example embodiment. Referring to FIG. 2, a memory 200 may include a plurality of (e.g., two) memory banks 210 and 212, a plurality of (e.g., two) multiplexers and sense amplifiers (MUX & S/A) 220 and 222, a plurality of (e.g., two) input/output circuits and pads 230 and 232, a row decoder 240 and a control logic block 250. Each of the plurality of memory banks 210 and 212 may include memory cells arranged in a plurality of rows and columns.

The row decoder 240 may be arranged between the memory banks 210 and 212 arranged in a row direction. A word line may extend in the row direction, and may be connected to memory cells in the memory banks 210 and 212.

The multiplexers and sense amplifiers 220 and 222 may be arranged at sides of the memory banks 210 and 212, respectively, in the row direction. The data input/output circuits and pads 230 and 232 may be arranged at sides of the multiplexers and sense amplifiers 220 and 222, which are not adjacent to the memory banks 210 and 212.

The control logic block 250 may be arranged between the data input/output circuits and pads 230 and 232. The control logic block 250 may generate signals (e.g., clock signals, control signals, etc.) for operating the memory 200. The control logic block 250 may further include a pre-decoder (not shown) for initially decoding a row address.

In FIG. 2, the number of rows in the memory banks may be less than or equal to 16 (e.g., 2, 4, 8, etc.). If the number of word lines is less than 16, as shown in FIG. 2, the input/output circuits and pads 230 and 233 may be arranged at sides of the memory banks 210 and 212.

Among signals transferring in the memory 200, the longest propagation delay may result from signals transferred through word and bit lines in the memory banks 210 and 212. As the size of the memory 200 is increased, the number of word lines increases and the length of bit lines may increase, which may lengthen signal delay. If the number of word lines is less than a given value (e.g., 16), a relatively small signal delay through a bit line may exist. Thus, the input/output circuits and pads 230 and 232 may be arranged at sides of the memory banks 210 and 212, thereby reducing an areal extension due to the multiplexers and pads. If the number of word lines is larger than the given value, the memory may be arranged as shown in FIG. 3.

Figure 3:
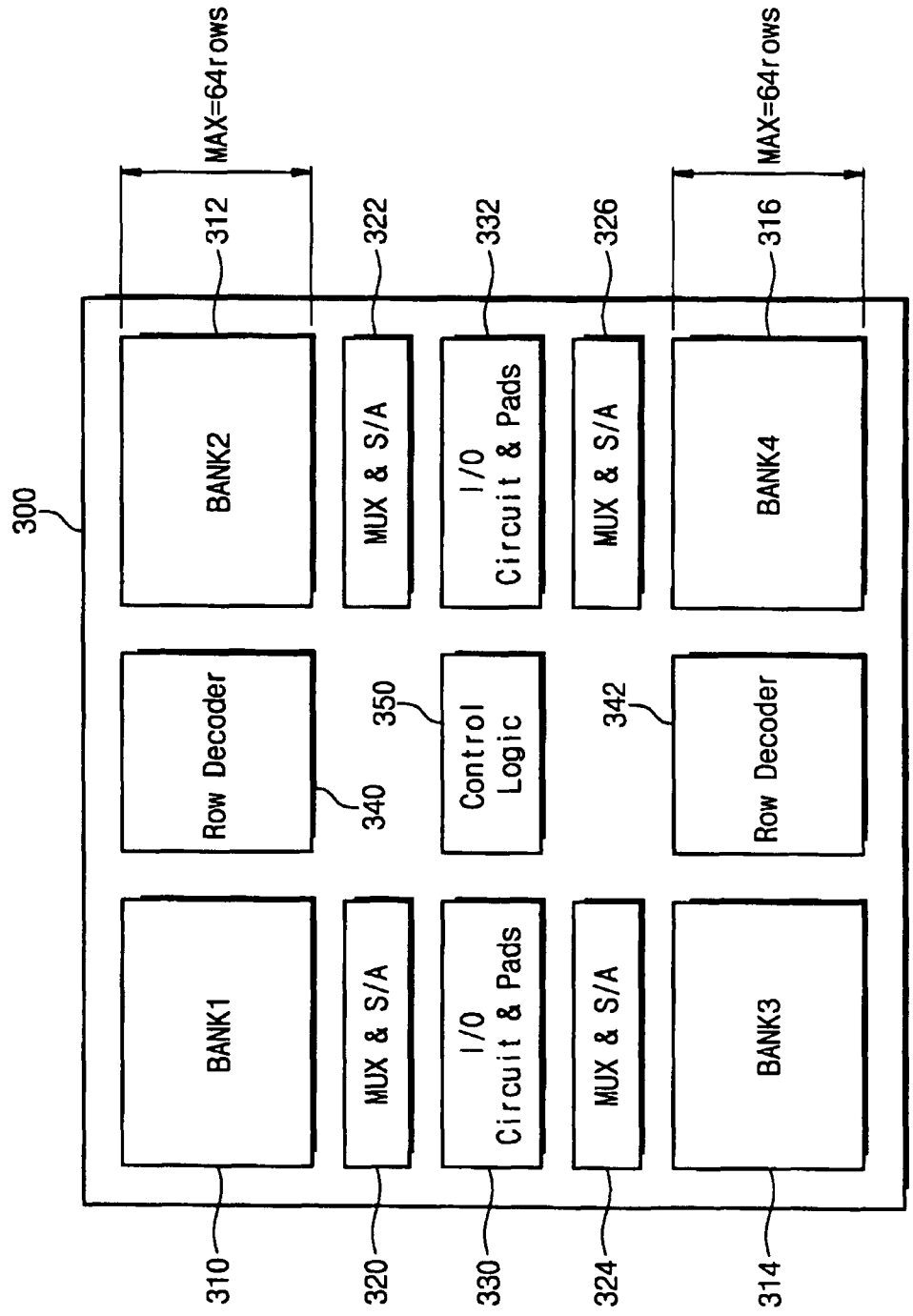
FIG. 3 is a block diagram illustrating a second memory layout designed by a computer-based compiling method according to an example embodiment.

FIG. 3 is a block diagram illustrating a second memory layout designed by a computer-based compiling method according to an example embodiment. The example embodiment shown in FIG. 3 may be used when the number of word lines is larger than the given number (e.g., 16).

Referring to FIG. 3, the memory 300 may include a plurality of (e.g., four) memory banks 310, 312, 314 and 316, a plurality of (e.g., four) multiplexers and sense amplifiers (MUX & S/A) 320, 322, 324 and 326, a plurality of (e.g., two) input/output circuits and pads 330 and 332, a plurality of (e.g., two) row decoders 340 and 342, and a control logic block 250. The memory banks 310, 312, 314 and 316 may include memory cells arranged in a plurality of rows and columns.

The row decoder 340 may be arranged between the memory banks 310 and 312 in the row direction, and the row decoder 342 may be arranged between the memory banks 314 and 316 in the row direction.

Between the memory banks 310 and 314, multiplexers and sense amplifiers 320 and 324 may be arranged adjacent thereto in a column direction. Between the memory banks 312 and 316, multiplexers and sense amplifiers 322 and 326 may be arranged adjacent thereto in a column direction.

The input/output circuits and pads 330 may be arranged between multiplexers and sense amplifiers 320 and 324, while input/output circuits and pads 332 may be arranged between multiplexers and sense amplifiers 322 and 326.

The control logic block 350 may be arranged between data input/output circuits and pads 330 and 332. The control logic block 350 may generate signals (e.g., clock signals, control signals, etc.) for operating the memory 300.

In the example embodiment shown in FIG. 3, the number of rows (e.g., word lines) may be larger than 16, but less than or equal to 64 in the memory banks 310, 312, 314 and 316. As discussed above, if the number of word lines is less than or equal to 16, multiplexers and sense amplifiers, 220 and 222, and input/output circuits and pads, 230 and 232, may be arranged at sides of the memory banks 210 and 212. But, as illustrated in FIG. 3, if the number of word lines is larger than 16, multiplexers and sense amplifiers, 320 and 322, and input/output circuits and pads, 330 and 332, may be arranged at a center among the memory banks 310, 312, 314 and 316. The word line may extend along the row direction, and may be connected to memory cells in the two banks 310 and 312 or the two banks 314 and 316.

The increased size of the memory 300 may result in an increased number of memory cells. By dividing the memory banks into, for example, four sections instead of two sections, the number of word lines in a single memory bank may decrease, which may reduce signal delay through bit lines.

This layout pattern may increase circuit area and may be used in a memory for a relatively high-frequency operation, even though circuit area may increase.

A layout method for a compilable memory in accordance with an example embodiment may be more flexibly carried out by selecting the disposition structures of the multiplexers and sense amplifiers, and the input/output circuits and pads in accordance with the number of word lines. Thus, a more efficient memory layout pattern capable of reducing a circuit area if the memory is smaller, and/or improving an operating speed if the memory is larger may be created.

Figure 4:
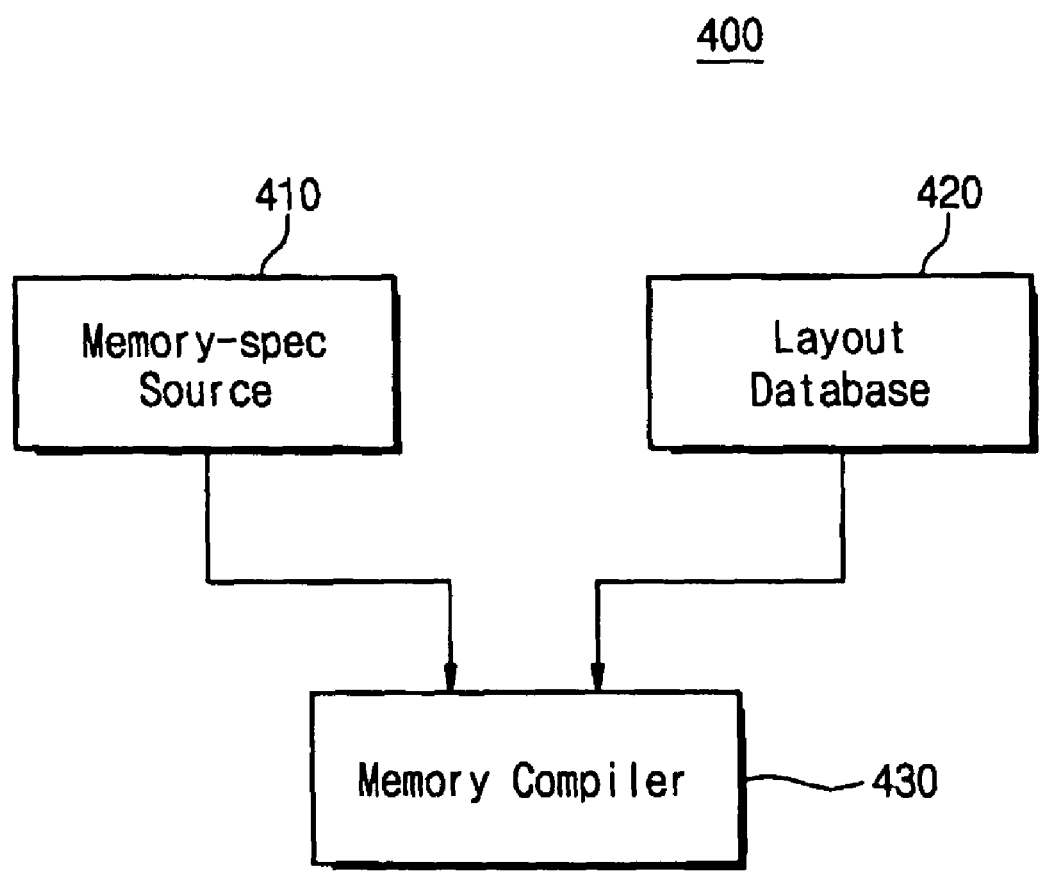
FIG. 4 is a diagram showing a composition of a memory compiling system according to an example embodiment.

FIG. 4 is a diagram showing an example composition of a memory compiling system according to an example embodiment. At least one memory may be arranged into a complete chip layout pattern by compiling a hardware description language (HDL), which may include memory circuit elements, a chip floor plane and/or a macro-layout through computer-aided design (CAD).

Example embodiments may be associated with a sequential CAD process for organizing a physical structure set by a memory capacity, an input/output data width, etc., in accordance with requirements of a memory. In addition, example embodiments of memory compiling systems may assemble various memory macro-layout patterns for completing the final memory layout arrangement.

As shown in FIG. 4, a memory compiler 430 may receive and accept memory specification data such as a memory capacity, an input/output data width, an address width, etc. from a memory specification source (hereinafter, 'memory-spec source') 410. A layout database 420 may store leaf cells and layout information for compiling the memory layout. The memory compiler 430 may create the memory layout with reference to, according to or based on the memory specification received from the memory-spec source 410, the leaf cells and/or layout information stored in the layout database 420.

The memory layout compiling system 400 shown in FIG. 4 may be implemented using a computer system. The memory-spec source 410 may be formed of a register or memory for storing information input through a keyboard of the computer system. The layout database 420 may be formed of a storage medium such as a memory device, a hard disk, a memory card or the like. The memory compiler 430 may be formed of a memory compiling program or a processor able to execute a program, for example, a program stored on a computer readable medium executable on a computer.

Figure 5:
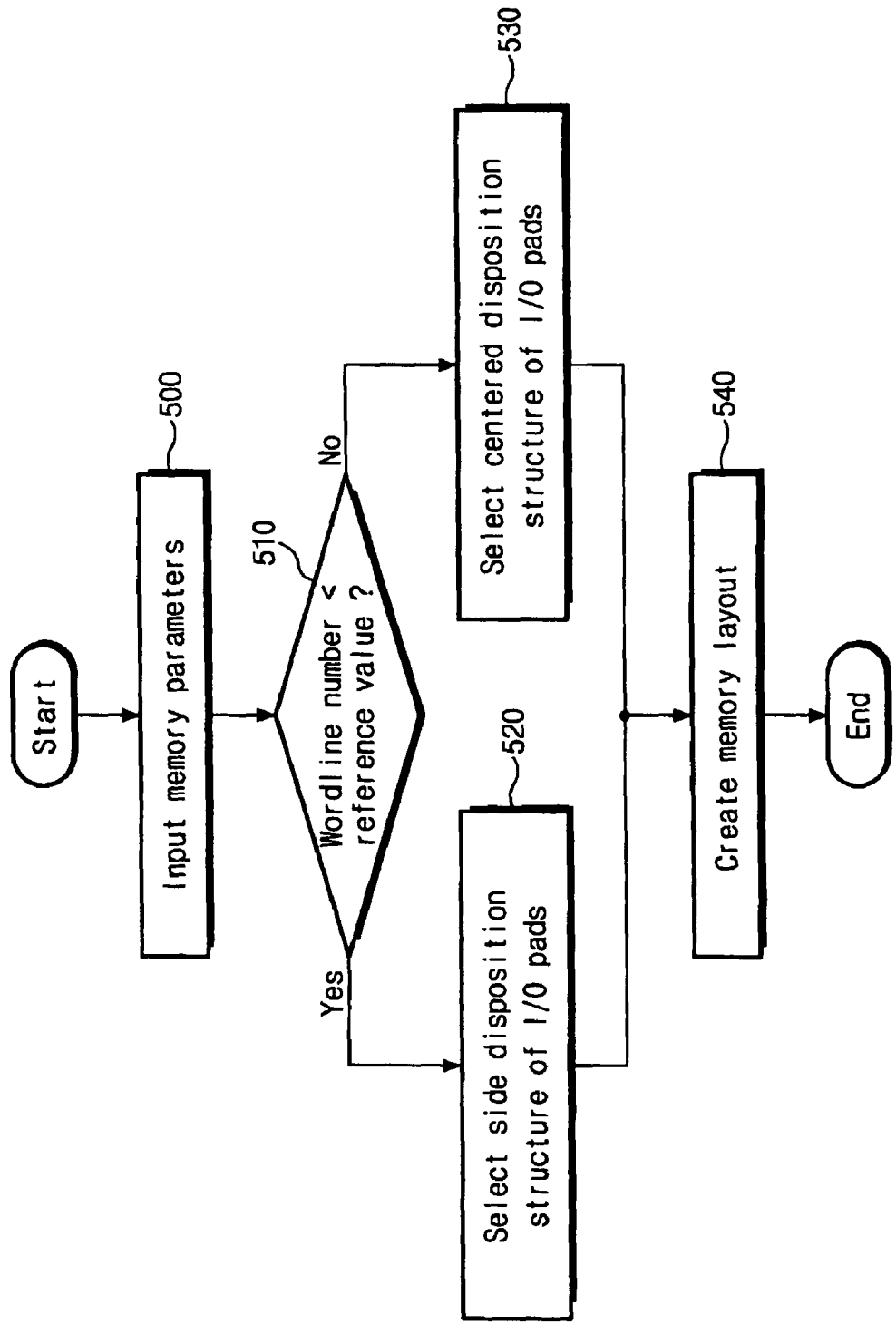
FIG. 5 is a flow chart showing a method of controlling the memory compiling system according to an example embodiment.

FIG. 5 is a flow chart illustrating a method of controlling the memory compiling system according to an example embodiment. The method of FIG. 5 may be used to control the memory 400 shown in FIG. 4. Referring to FIG. 5, at 500, memory parameters may be input memory into the memory-spec source 410, for example, by a user. The memory parameters may include a memory capacity, a data width, the number of word lines, etc. The memory parameters may further include a clock frequency and/or the number of banks. The input memory parameters may be stored in the memory-spec source 410.

At 510, the memory compiler 430 may compare a reference value with the number of word lines input by the user. As discussed with regard to FIGS. 2 and 3, the reference value may be provided and used to determine a layout type of the memory, which is set to 16 in this example. If the number of word lines is less than 16, as shown in FIG. 2, the memory compiler 430 may select the layout structure in which the input/output circuits and pads are disposed at sides of the memory banks at 520. If the number of word lines is greater than 16, as shown in FIG. 3, the memory compiler 430 may select the layout structure in which the input/output circuits and pads are disposed at the center between the memory banks at 530.

At 540, the memory compiler 430 may create the final layout according to the selected layout structure with reference to the memory specification received and accepted from the memory-spec source 410, the leaf cells and/or layout information stored in the layout database 420.

As such, because signal delay on a bit line may decrease if the number of word lines is less than the given reference value, as shown in FIG. 2, the input/output circuits and pads may be disposed at sides of the memory banks to reduce circuit area of the memory. Otherwise, because signal delay on a bit line may increase if the number of word lines is greater than the given reference value, as shown in FIG. 3, the input/output circuits and pads may be disposed at the center between the memory banks to reduce bit line signal delay.

Figure 6:
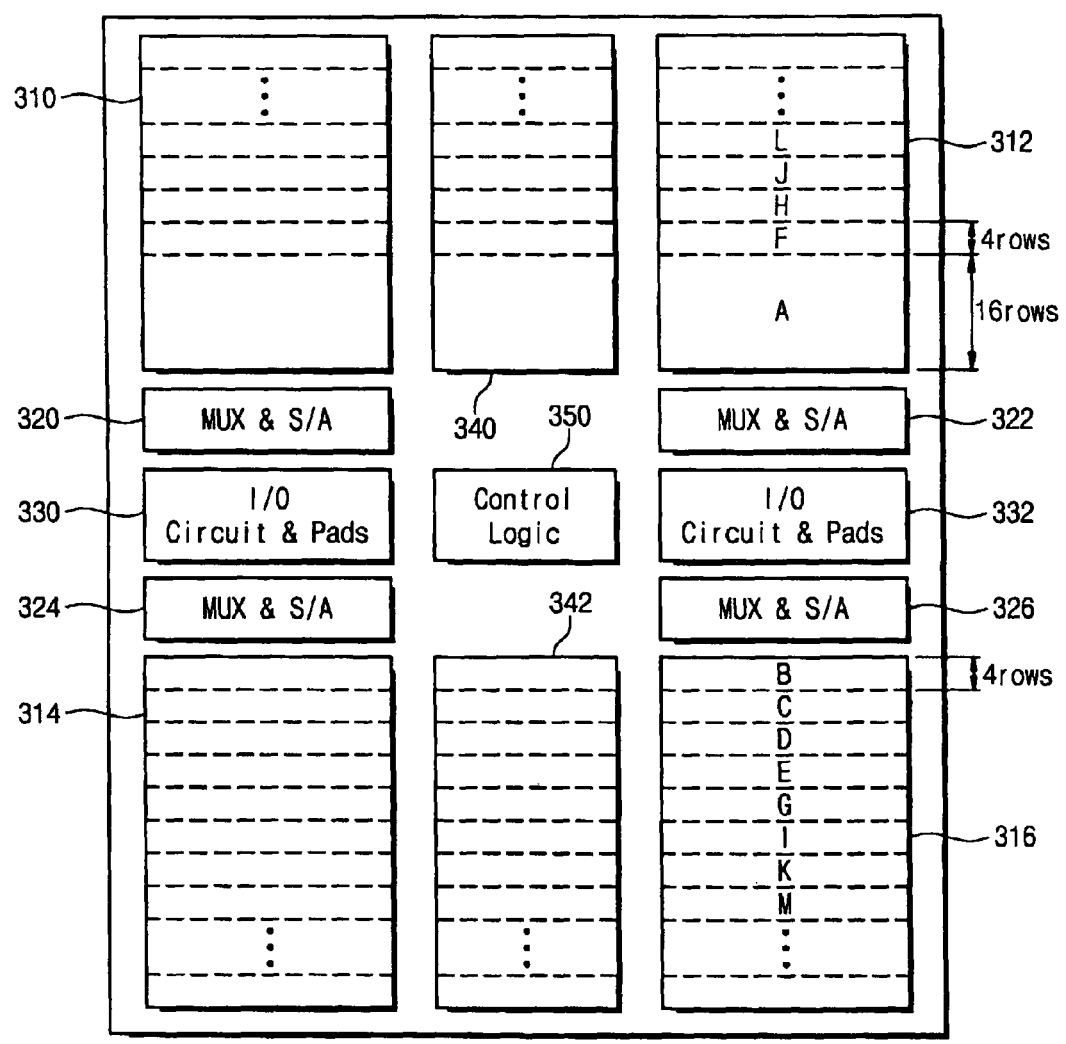
FIG. 6 is a diagram illustrating size variations of memory banks by the number of word lines in a centered disposition structure of input/output pads shown in FIG. 3.

FIG. 6 is a diagram illustrating example configurations of various size memory banks 310, 312, 314 and 316 in a center disposition structure of input/output pads shown in FIG. 3. If the number of word lines set by the user is greater than 16, as shown in FIG. 3, multiplexers and sense amplifiers, 320, 322, 324, 326 and input/output circuits and pads, 330 and 322 may be disposed at the center between the memory banks 310, 312, 314 and 316. As discussed above, a word line may extend in the row direction, and may be coupled to memory cell arrays of the upper memory banks 310 and 312 and memory cell arrays of the lower memory banks 314 and 316.

For example, if the number of word lines is one of 17, 18, 19 and 20, the memory cell array coupled to 16 word lines may be arranged in the upper memory banks 310 and 312, while the memory cell arrays coupled to the remaining 1, 2, 3 or 4 word lines may be arranged in the lower memory banks 314 and 316. Therefore, if the number of word lines is 20, the memory cell arrays may be arranged up to a region A in the upper memory banks 310 and 312, but up to a region B in the lower memory banks 314 and 316.

In this example, the memory cell arrays may be arranged in sequence from region A to a region L in the upper memory banks 310 and 312 according to the number of word lines. In the lower memory banks 314 and 316, the memory cell arrays may be arranged in sequence from region B to region M. Region A may be arranged with the memory cell array coupled to 16 word lines, while each of regions B and M may be arranged with the memory cell arrays coupled each to less than or equal to 4 word lines. While in this example embodiment each of regions B and M includes less than or equal to 4 word lines, each of regions B and M may include any number of word lines, for example, 2, 8, or 16 word lines.

According to example embodiments, regions of the memory cell arrays may be arranged alphabetically as shown in FIG. 6 from the region A to the region M. For example, if the number of word lines is 40, the memory cell arrays may be arranged from region A to region G. In the upper memory banks 310 and 312, the memory cell arrays may be arranged at regions A and F. In the lower memory banks 314 and 316, the memory cell arrays may be arranged from region B to region G.

Accordingly, the number of word lines arranged in the upper memory banks 310 and 312 may be different from that in the lower memory banks 314 and 316 by, for example, less than or equal to 4.

As such, memory compiling methods according to example embodiments may reduce bit line length by arranging memory cell arrays such that the data input/output circuits and pads 330 and 332 are closer to the banks 310, 312, 314, and 316, thereby shortening signal delay through bit lines.

In arranging the memory cell arrays as shown in FIG. 6, corresponding row decoders may be designed in accordance with the number of word lines because while a bank selection signal of bits from the LSB to the fifth in a row address signal may be sufficient, for example, when the number of word lines is greater than 16, but less than 32. Bits from the LSB to the third of the row address signal may be necessary for a bank selection signal to designate the upper and lower memory banks 310, 312, 314, and 316 in a unit of 4 word lines when the number of word lines is greater than or equal to 32.

Figure 7:
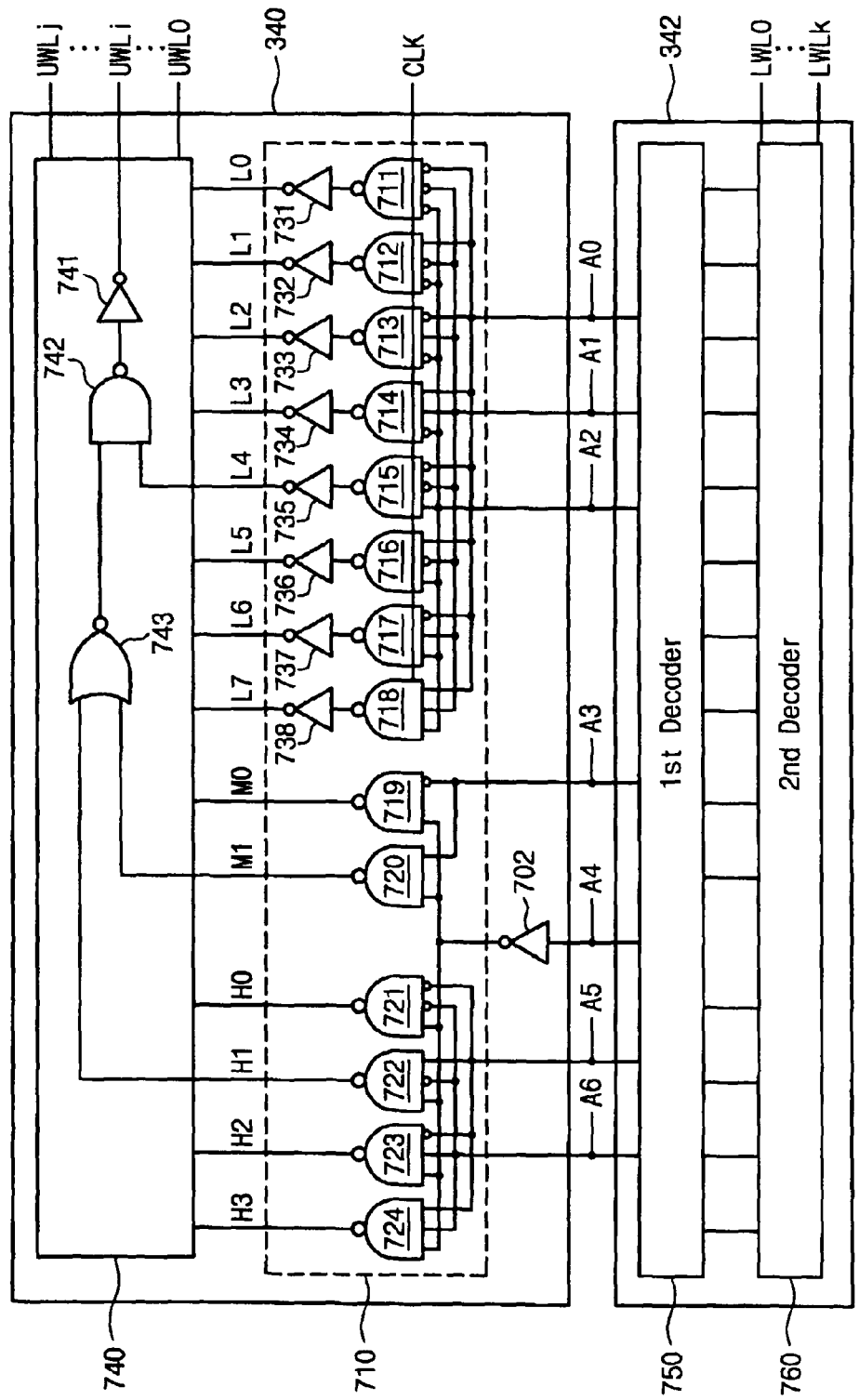
FIG. 7 is a circuit diagram illustrating an example structure of row decoders according to an example embodiment.

FIG. 7 is a circuit diagram illustrating an example structure of row decoders 340 and 342 in FIG. 3, for example, when the number of word lines is less than 32, but greater than 16.

Referring to FIG. 7, the row decoder 340 may be connected to upper word lines UWL0~UWLj corresponding to the upper memory banks 310 and 312, and row decoder 342 may be connected to lower word lines LWL0~LWLk corresponding to the lower memory banks 314 and 316.

The row decoder 340 may include an inverter 702, a first decoder 710 and a second decoder 740. The row decoder 342 may include first and second decoders 750 and 760. The first decoders 710 and 750 of the row decoders 340 and 342 may have the same or substantially the same structure and operation, while the second decoders 740 and 760 of the row decoders 340 and 342 may have the same or substantially the same structure and operation. Thus, for the sake of brevity, only row decoder 340 will be described.

Referring to FIG. 7, the inverter 702 may receive the LSB through fifth bits of the row address signal as a bank selection signal A4. The first decoder 710 may include a plurality of NAND gates 711~724 and inverters 731~738. Each of the NAND gates 711~718 may receive row address signals A0~A2. The inverters 731~738 may output first signals L0~L7, respectively. The NAND gates 719 and 720 may receive a bank address signal A3 and a bank address signal A4 output via the inverter 702, and output second signals M0 and M1 respectively. The NAND gates 721~724 may receive row address signals A5 and A6, and output third signals H0~H3.

The second decoder 740 may receive the first through third signals L0~L7, M0 and M1, and H0~H3 from the first decoder 710, and selectively activate one of the upper word lines UWL0~UWLj. The second decoder 740 may include a NOR gate 743, a NAND gate 742, and an inverter 741. The NOR gate 743 may receive one of the second signals M0 and M1 and one of the third signals H0~H3. While in FIG. 7 only a single one of the NOR gate 743 is shown, the second decoder 740 may include a plurality of (e.g., 8) NOR gates corresponding to combinations of the second signals M0 and M1 and the third signals H0~H3.

The NAND gate 742 may receive an output from the NOR gate 743 and one of outputs from the inverters 731~738. While in FIG. 7 only a single one of the NAND gate 742 is shown, the second decoder 740 may include a plurality of (e.g., 64) NAND gates corresponding to the combinations of the first signals L0~L7 and outputs of the plurality of NOR gates 743.

As such, the row decoder 340 may activate one of the upper word lines UWL0~UWLj according to the row address signals A0~A3 and A5~A7 when the bank selection signal A4 is at a low logic level. The row decoder 342 may activate one of the lower word lines LWL0~LWLk according to the row address signals A0~A3 and A5~A7 when the bank selection signal A4 is at a high logic level.

Figure 8:
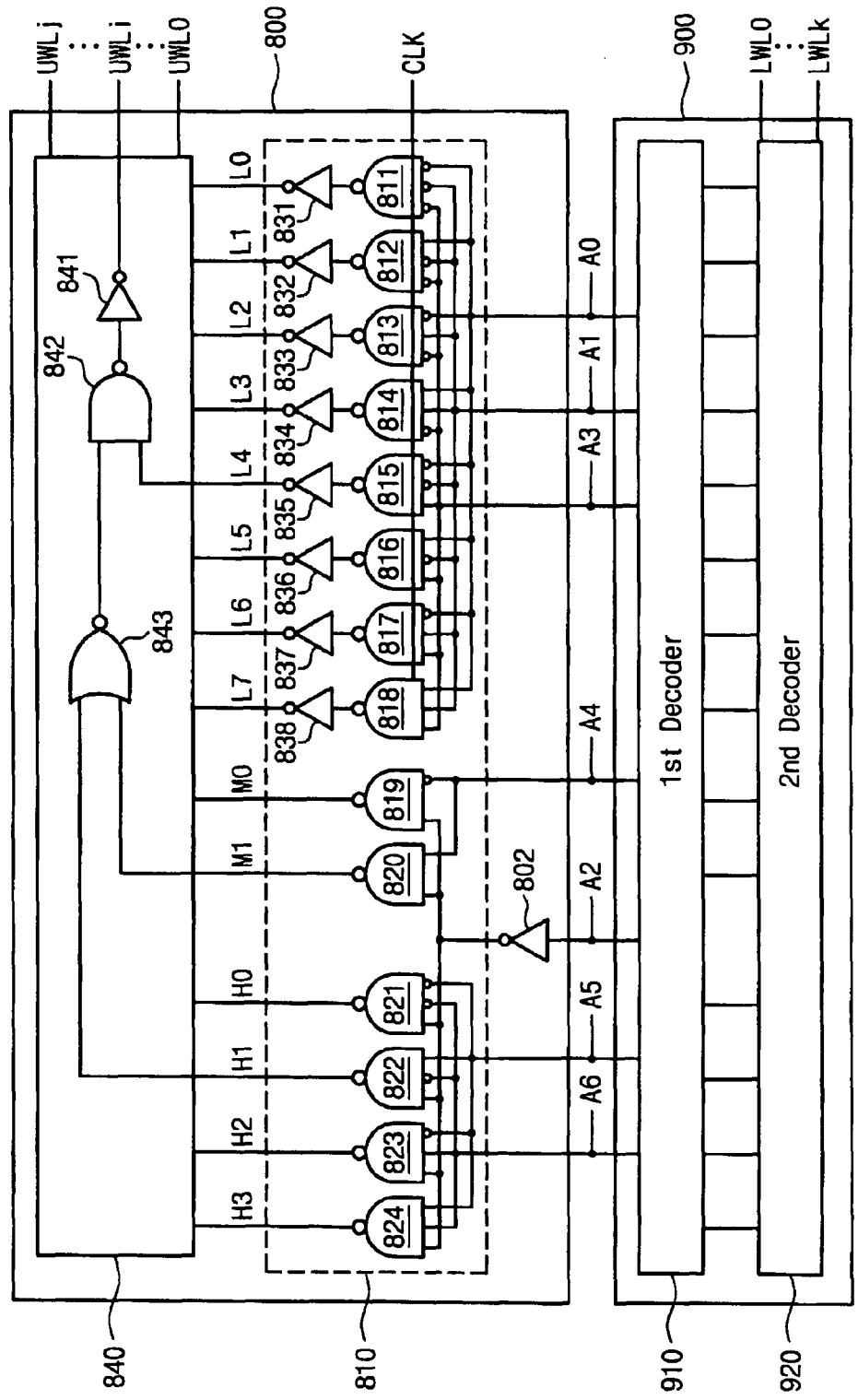
FIG. 8 is a circuit diagram illustrating an example structure of row decoders according to another example embodiment.

FIG. 8 is a circuit diagram illustrating a structure of row decoders when the number of word lines is greater than 32. The row decoders 800 and 900 shown in FIG. 8 examples of the row decoders 340 and 342 shown in FIG. 3. However, the row decoder 800 shown in FIG. 8 is different from the row decoder 340 shown in FIG. 7 in that inverter 802 receives the LSB through third (A2) bits of the row address signal as a bank selection signal.

As described above in conjunction with FIG. 6, if the number of word lines is greater than 32, 4 word lines may be incremented alternately in the upper memory banks 310 and 312 and the lower memory banks 314 and 316. Therefore, the bank selection signal may be used with the LSB through third (A2) bits of the row address signal when the number of word lines is greater than 32.

Referring to FIG. 8, NAND gates 811~818 may receive the row address signals A0, A1, and A3 while NAND gates 819 and 820 may receive the row address signal A4. NAND gates 821~824 may receive the row address signals A5 and A6. The row decoder 800 shown in FIG. 8 may have the same or substantially the same circuit architecture as the row decoder 340 shown in FIG. 7, except for the permutation of the row address signals.

Example embodiments of memory compiling methods may make permutation of row address signals variable in accordance with the number of word lines selected by a user. Thereby, the same or substantially the same circuit architecture may be available for accomplishing various row decoder layouts even when varying an incremental unit (e.g., by 16 or 4) of word lines in the memory banks 310, 312, 314 and 316.

Example embodiments may provide improved operating speed in accordance with memory specification required therefor and/or may compile a memory in having reduced size.

Moreover, example embodiments may more enable row decoders to be designed more easily although the number of word lines in a memory is variable.

Methods and systems according to example embodiments may be machine implemented via one or more computers or processors. In addition, the systems discussed herein may be embodied in the form of one or more computers configured to carry out methods described herein.

Example embodiments may also be implemented, in software, for example, as any suitable computer program. For example, a program in accordance with one or more example embodiments may be a computer program product causing a computer to execute one or more of the example methods described herein: a method for controlling a memory compiling system.

The computer program product may include a computer-readable medium having computer program logic or code portions embodied thereon for enabling a processor of the apparatus to perform one or more functions in accordance with one or more of the example methodologies described above. The computer program logic may thus cause the processor to perform one or more of the example methodologies, or one or more functions of a given methodology described herein.

The computer-readable medium may be a built-in medium installed inside a computer main body or removable medium arranged so that it can be separated from the computer main body. Examples of the built-in medium include, but are not limited to, rewriteable non-volatile memories, such as RAMs, ROMs, flash memories, and hard disks. Examples of a removable medium may include, but are not limited to, optical storage media such as CD-ROMs and DVDs; magneto-optical storage media such as MOs; magnetism storage media such as floppy disks (trademark), cassette tapes, and removable hard disks; media with a built-in rewriteable non-volatile memory such as memory cards; and media with a built-in ROM, such as ROM cassettes.

These programs may also be provided in the form of an externally supplied propagated signal and/or a computer data signal (e.g., wireless or terrestrial) embodied in a carrier wave. The computer data signal embodying one or more instructions or functions of an example methodology may be carried on a carrier wave for transmission and/or reception by an entity that executes the instructions or functions of the example methodology. For example, the functions or instructions of the example embodiments may be implemented by processing one or more code segments of the carrier wave, for example, in a computer, where instructions or functions may be executed for determining a parameter in a system for implementing a future clinical study, in accordance with example embodiments described herein.

Further, such programs, when recorded on computer-readable storage media, may be readily stored and distributed. The storage medium, as it is read by a computer, may enable the methods and/or apparatuses, in accordance with the example embodiments described herein.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of compiling a memory using a computer, the method comprising:
   inputting a memory specification of the memory to a memory compiler embodied in hardware of the computer;
   determining, by the memory compiler of the computer, a structure of input/output pads with reference to the memory specification, the memory specification including a number of word lines; and
   creating, by the memory compiler of the computer, a memory layout based on the determined structure of the input/output pads.

2. The method as set forth in claim 1, wherein determining the structure of input/output pads includes,
   selecting a first layout of the input/output pads in which the input/output pads are arranged at a side of the memory if the number of word lines is less than a desired positive reference value.

3. The method as set forth in claim 2, wherein creating the memory layout includes,
   creating a plurality of memory bank regions, each memory bank region including a plurality of word lines, a plurality of bit lines and a plurality of memory cells arranged at intersections of the plurality of word lines and bit lines,
   creating a row decoder region between memory bank regions adjacent to each other in a row direction,
   creating an input/output pad region at a side of each of the memory bank regions, and
   creating a sense amplifier region between each memory bank region and corresponding input/output pad region.

4. The method as set forth in claim 1, wherein determining the structure of the input/output pads includes,
   selecting a first layout in which the input/output pads are arranged at a center of the memory if the number of word lines is larger than a desired positive reference value.

5. The method as set forth in claim 4, wherein creating the memory layout includes,
   creating a plurality memory bank regions arranged in rows and columns, each of the memory bank regions including a plurality of word lines, a plurality of bit lines and a plurality of memory cells arranged at intersections of the plurality of word lines and bit lines,
   creating a row decoder region between memory bank regions adjacent to each other in a row direction,
   creating an input/output pad region between memory bank regions adjacent to each other in a column direction, and
   creating a sense amplifier region between each memory bank region and corresponding input/output pad region in a column direction.

6. The method as set forth in claim 5, wherein creating the plurality of memory bank regions includes,
   disposing a first portion of the plurality of word lines in a first set of memory bank regions, the first set of memory bank regions being arranged at an upper side of the input/output pad regions, and
   disposing a second portion of the plurality of word lines in a second set of memory bank regions, the second set of memory bank regions being arranged at a lower side of the input/output pad regions.

7. The method as set forth in claim 6, wherein a number of word lines in the first set of word lines are different from a number of word lines in the second set of word lines.

8. The method as set forth in claim 7, wherein the number of word lines in the first set of word lines is different from the number of word lines in the second set of word lines by four.

9. A computer-based memory design system for compiling a memory for layout, the system comprising:
   a specification source for the memory;
   a database configured to store a plurality of device libraries forming the memory; and
   a memory compiler configured to create a memory layout for the memory by arranging the plurality of device libraries stored in the database based on the specification source; wherein
      the memory compiler determines a structure of input/output pads in the memory layout based on a number of word lines set in the specification source.

10. The computer-based memory design system as set forth in claim 9, wherein the memory compiler creates the memory layout from a first layout in which the input/output pads are arranged at a side of the memory if the number of word lines is less than a desired positive reference value.

11. The computer-based memory design system as set forth in claim 10, wherein the memory compiler creates the memory layout from a second layout in which the input/output pads are arranged at the center of the memory if the number of word lines is larger than a desired positive reference value.

12. A memory comprising:
   a plurality of memory banks, each of the plurality of memory banks including a plurality of word lines, a plurality of bit lines and a plurality of memory cells arranged at intersections of the plurality of word lines and bit lines;
   a plurality of row decoders, each of the plurality of row decoders being arranged between two memory banks adjacent to each other in a row direction, the plurality of row decoders being configured to selectively activate the plurality of word lines based on row address signals input from an external source; and
   a plurality of input/output pads, each of the plurality of input/output pads being disposed at a side of one of the plurality of memory banks in a column direction; wherein the plurality of row decoders receive the plurality of row address signals altered in a permutation in accordance with a size of the memory banks.

13. The memory as set forth in claim 12, wherein a first set of memory banks of the plurality of memory banks are arranged at an upper side of the input/output pads and include a first portion of the plurality of word lines, and a second set of memory banks of the plurality of memory banks are arranged at a lower side of the input/output pads and include a second portion of the plurality of word lines.

14. The memory as set forth in claim 13, wherein a number of word lines in the first portion of the plurality of word lines is different from a number of word lines in the second portion of the plurality of word lines.

15. The memory as set forth in claim 14, wherein the number of word lines in the first portion of the plurality of word lines is different from the number of word lines in the second portion of the plurality of word lines by less than or equal to four.

16. The memory as set forth in claim 12, wherein the row address signals include a bank selection signal.

17. The memory as set forth in claim 16, wherein a row decoder corresponding to the first set of memory banks of the plurality of memory banks arranged at an upper side of the input/output pads activates one of the plurality of word lines included in the first set of memory banks of the plurality of memory banks when the bank selection signal is at a first level.

18. The memory as set forth in claim 17, wherein a row decoder corresponding to the second set of memory banks of the plurality of memory banks arranged at a lower side of the input/output pads activates one of the plurality of word lines included in the second set of memory banks of the plurality of memory banks when the bank selection signal is at a second level.

19. The memory as set forth in claim 12, wherein a first set of the plurality of row decoders includes,
   a first decoder configured to generate a plurality of word line selection signals based on a plurality of received row address signals; and
   a second decoder configured to selectively activate a word line of one of the plurality of memory banks based on the received plurality of word line selection signals, the one of the plurality of memory banks being adjacent to the first row decoder.

20. The memory as set forth in claim 12, wherein each of the plurality of input/output pads is disposed between two adjacent memory banks in a column direction.

21. A system on chip comprising:
   the memory as set forth in claim 12.

* * * * *